(12) United States Patent
Zhang et al.

(10) Patent No.: US 11,587,994 B2
(45) Date of Patent: Feb. 21, 2023

(54) METHOD FOR MANUFACTURING PIXEL DEFINITION LAYER AND DISPLAY PANEL, AND DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Shitao Zhang, Beijing (CN); Li Xiong, Beijing (CN); Cheng Tang, Beijing (CN); Hao Zhang, Beijing (CN); Qijun Zhao, Beijing (CN); Heping Yang, Beijing (CN); Gaoliang Xue, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 212 days.

(21) Appl. No.: 16/968,017

(22) PCT Filed: Dec. 18, 2019

(86) PCT No.: PCT/CN2019/126370
§ 371 (c)(1),
(2) Date: Aug. 6, 2020

(87) PCT Pub. No.: WO2020/140762
PCT Pub. Date: Jul. 9, 2020

(65) Prior Publication Data
US 2021/0367012 A1    Nov. 25, 2021

(30) Foreign Application Priority Data
Jan. 3, 2019 (CN) .......................... 201910005631.5

(51) Int. Cl.
H01L 27/32 (2006.01)
H01L 51/00 (2006.01)
H01L 51/56 (2006.01)

(52) U.S. Cl.
CPC ...... *H01L 27/3246* (2013.01); *H01L 51/0005* (2013.01); *H01L 51/0018* (2013.01); *H01L 51/56* (2013.01)

(58) Field of Classification Search
None
See application file for complete search history.

(56) References Cited

U.S. PATENT DOCUMENTS 8,604,494 B2  12/2013  Matsushima
9,269,754 B2  2/2016  Lee et al.
(Continued)

FOREIGN PATENT DOCUMENTS

CN   102577613 A   7/2012
CN   104332394 A   2/2015
(Continued)

OTHER PUBLICATIONS

International Search Report and Written Opinion for International Application No. PCT/CN2019/126370 dated Mar. 18, 2020.
(Continued)

*Primary Examiner* — Michelle Mandala
(74) *Attorney, Agent, or Firm* — Xsensus LLP

(57) ABSTRACT

A method for manufacturing the pixel definition layer includes forming a photolithographic material film on a substrate; performing a pre-drying treatment, a first exposure treatment, and a development treatment sequentially on the photolithographic material film to form an initial pattern of the pixel definition layer; and performing a second
(Continued)

exposure treatment and a curing treatment sequentially on the initial pattern to form a final pattern of the pixel definition layer.

17 Claims, 2 Drawing Sheets

(56) References Cited

U.S. PATENT DOCUMENTS

| | | | |
|---|---|---|---|
| 2012/0091441 | A1 | 4/2012 | Matsushima |
| 2015/0295014 | A1 | 10/2015 | Lee et al. |
| 2019/0229152 | A1* | 7/2019 | Wang .................... H01L 51/56 |

FOREIGN PATENT DOCUMENTS

| | | | |
|---|---|---|---|
| CN | 105070650 | A | 11/2015 |
| CN | 105874882 | A | 8/2016 |
| CN | 105914223 | A | 8/2016 |
| CN | 106384744 | A | 2/2017 |
| CN | 106462062 | A | 2/2017 |
| CN | 107026187 | A | 8/2017 |
| CN | 107689421 | A | 2/2018 |
| CN | 107689427 | A | 2/2018 |
| CN | 107706317 | A | 2/2018 |
| CN | 107968108 | A | 4/2018 |
| CN | 108428719 | A | 8/2018 |
| CN | 105070650 | B | 11/2018 |
| CN | 109585523 | A | 4/2019 |
| CN | 107689421 | B | 1/2020 |
| JP | 5613851 | B1 | 10/2014 |
| JP | WO2015129092 | A1 | 3/2017 |
| JP | WO2016024425 | A1 | 5/2017 |
| JP | 6443436 | B2 | 12/2018 |
| KR | 20160118216 | A | 10/2016 |
| KR | 20170041170 | A | 4/2017 |
| KR | 101852050 | B1 | 4/2018 |
| TW | 201533524 | A | 9/2015 |
| TW | I609239 | B | 12/2017 |
| WO | 2015129092 | A1 | 9/2015 |
| WO | 2016024425 | A1 | 2/2016 |

OTHER PUBLICATIONS

First Office Action for CN Patent Application No. 201910005631.5 dated Apr. 16, 2020.

Second Office Action for CN Patent Application No. 201910005631.5 dated Nov. 13, 2020.

* cited by examiner

Fig.5

Fig.6

METHOD FOR MANUFACTURING PIXEL DEFINITION LAYER AND DISPLAY PANEL, AND DISPLAY PANEL

CROSS REFERENCE TO RELATED APPLICATIONS

This application is a 35 U.S.C. § 371 national phase application based on International Application No. PCT/CN2019/126370 filed on Dec. 18, 2019, which is based on and claims priority to Chinese Patent Application No. 201910056315 filed on Jan. 3, 2019, the disclosures of which being incorporated by reference in their entireties herein.

TECHNICAL FIELD

The present disclosure relates to the field of display technology, in particular to a method for manufacturing a pixel definition layer, a method for manufacturing a display panel and a display panel.

BACKGROUND

At present, in a flexible AMOLED (Active-Matrix Organic Light-Emitting Diode) process, a light-emitting layer is formed in an opening area of a pixel definition layer mainly by an organic material evaporation process. After the light-emitting layer is manufactured, it is also required to carry out an ink jet printing process on the light-emitting layer such that a thin film package can be realized.

It should be noted that those contents as disclosed in the Background portion are merely used to reinforce understanding of the background technology of the present disclosure, accordingly the Background portion may include information that does not constitute the related art as already known by an ordinary person skilled in the art.

SUMMARY

The first aspect of the present disclosure provides a method for manufacturing a pixel definition layer, which includes steps of:

forming a photolithographic material film on a substrate;

performing a pre-drying treatment, a first exposure treatment and a development treatment sequentially on the photolithographic material film to form an initial pattern of the pixel definition layer;

performing a second exposure treatment and a curing treatment sequentially on the initial pattern to form a final pattern of the pixel definition layer.

In an exemplary embodiment of the present disclosure, performing the second exposure treatment on the initial pattern includes:

performing the second exposure treatment on the initial pattern by using an I-line ultraviolet light.

In an exemplary embodiment of the present disclosure, illumination intensity of the I-line ultraviolet light is 120 mW/cm² to 250 mW/cm².

In an exemplary embodiment of the present disclosure, the method further includes performing vacuum drying treatment on the photolithographic material film before performing the pre-drying treatment on the photolithographic material film.

In an exemplary embodiment of the present disclosure, the vacuum drying treatment comprises a plurality of treatment stages, and pressures at the treatment stages are sequentially reduced.

In an exemplary embodiment of the present disclosure, the pressure at a final treatment stage of the treatment stages is 300 Pa to 700 Pa.

In an exemplary embodiment of the present disclosure, a total working time used in the vacuum drying treatment is 110 s to 130 s.

In an exemplary embodiment of the present disclosure, the thickness of the photolithographic material film is 1.8 µm-4.5 µm.

The second aspect of the present discourse provides a method for manufacturing a display panel, including:

forming a pixel definition layer on a substrate, the pixel definition layer being manufactured by the method of manufacturing the pixel definition layer according to any one of the embodiments;

forming a light-emitting layer in an opening area on the pixel definition layer;

forming a packaging layer on the light-emitting layer.

In an exemplary embodiment of the present disclosure, the packaging layer includes an organic packaging film;

forming the packaging layer on the light-emitting layer comprises:

forming an organic packaging film on the light-emitting layer by using an ink jet printing process.

The third aspect of the present disclosure provides a display panel manufactured by the method for manufacturing the aforesaid display panel.

It is to be understood that both the foregoing general description and the following detailed description are exemplary and explanatory only and are not restrictive of the invention as claimed.

This section provides an overview of various implementations or examples of the techniques described in present disclosure, and rather than a full disclosure of the full scope or all the features of the disclosed techniques.

BRIEF DESCRIPTION OF THE DRAWINGS

The accompanying drawings, which are incorporated in and constitute a part of this specification, illustrate embodiments of the present disclosure, and together with the description serve to explain the inventive concepts. Understandably, the drawings as described below are only exemplary, based on which the other drawings may be obtained by the person skilled in the art without any creative work.

Figures 5, 6:
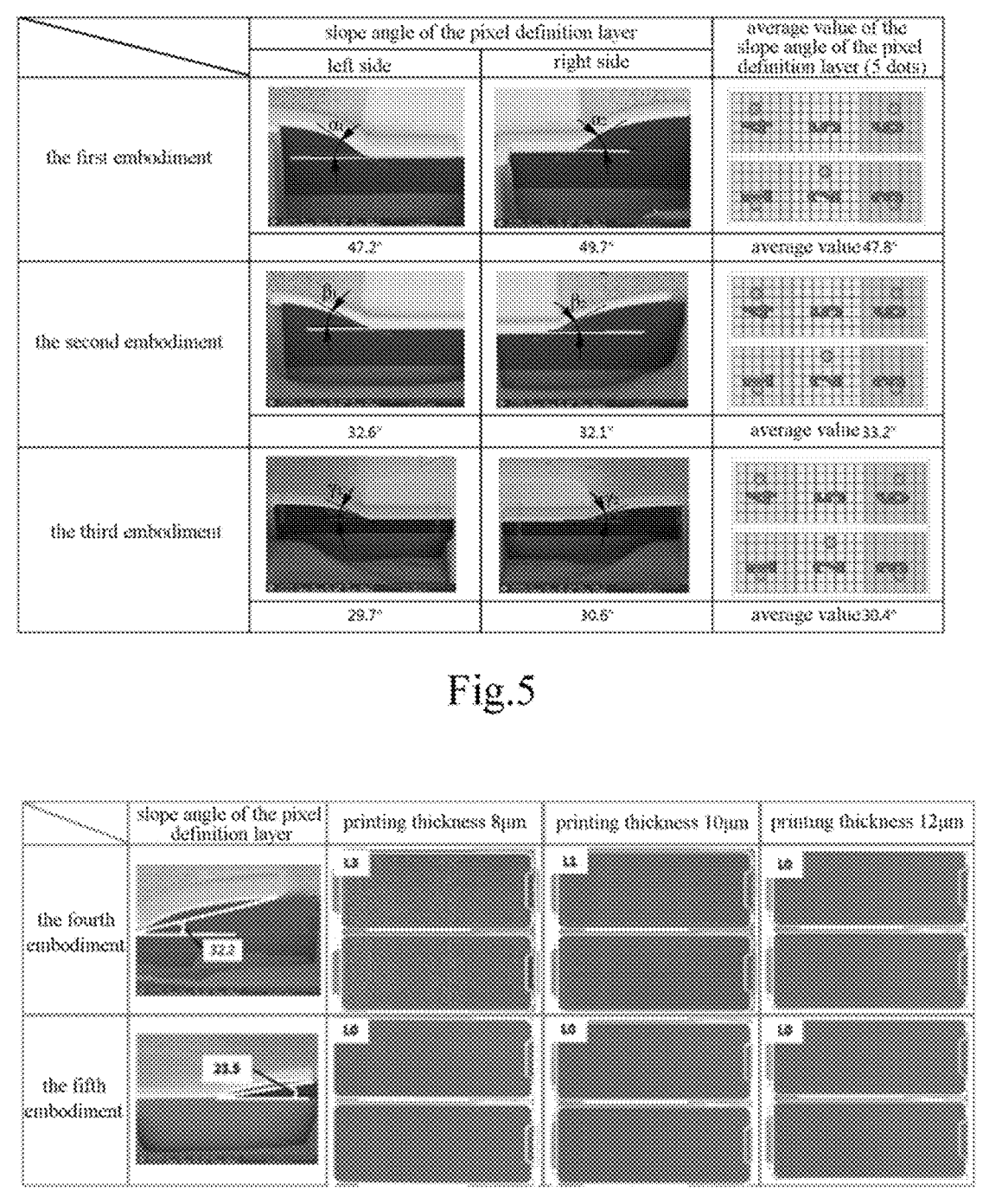

FIG. 5 shows a comparison diagram of test results of pixel definition layers manufactured according to three implementation solutions; and FIG. 6 shows a comparison diagram of test results of pixel definition layers manufactured according to another two implementation solutions.

DETAILED DESCRIPTION

Figure 1:
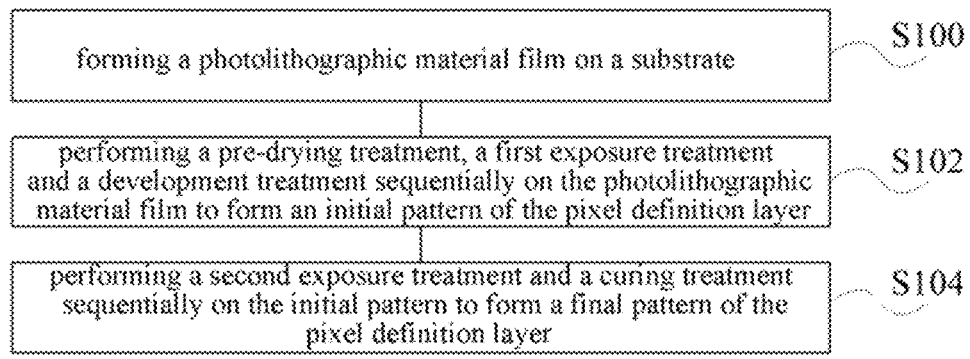
FIG. 1 shows a flowchart of a method for manufacturing a pixel definition layer according to the present disclosure.

Now, the exemplary implementations will be described more completely with reference to the accompanying drawings. However, the exemplary implementations can be done in various forms and should not be construed as limiting the implementations as set forth herein. Instead, these implementations are provided so that this disclosure will be thorough and complete, and concept of the exemplary implementation will be fully conveyed to those skilled in the art. Same reference numbers denote the same or similar structures in the figures, and thus the detailed description thereof will be omitted.

The relative words, such as "upper" or "lower", as used herein, are directed to describe a relative relationship between one component and the other component of an icon. These words are used herein for convenience only, for example, according to the direction of the illustrative examples as shown in the figures. It should be appreciated that if the referenced device is inversed upside down, the component indicated as being the "upper" side would become the component on the "lower" side. When one structure is "on" another structure, it is possible to indicate that the one structure is integrally formed on the other structure, or the one structure is "directly" arranged on the other structure, or one structure is "indirectly" formed on the other structure by means of a further structure.

The terms "a", "an", "the", and "said", when describing an element, constituent, or the like as described and/or shown herein, are used to express the presence of one or more of the element, constituent, or the like. The terms "include", "comprise", and "have", as used herein, are intended to be inclusive, and mean there may be additional elements, constituents, or the like other than the listed elements, constituents, or the like. The words "first", "second", or the like, as used in claims, are meant to indicate, but not to limit, the object to which they modify.

Now, in the flexible AMOLED process, in order to improve the Mura phenomenon, it is generally adopted to increase printing thickness in an ink jet printing process, but this will lead to an increase in potential adverse risks of products, and an increase in material cost and process time, thus reducing production capacity.

In addition, since the ink jet printing process can be affected by a slope angle of the pixel definition layer, that is, if the slope angle of the pixel definition layer is too large, it is difficult to level ink in the ink jet printing process, and thus the Mura phenomenon is easy to occur. Therefore, it is possible to reduce the slope angle of the pixel definition layer to improve the Mura phenomenon.

In the related art, the pixel definition layer can be formed by performing a photolithography process on photolithographic materials, so that the slope angle of the pixel definition layer can be reduced by improving photolithography conditions.

Where the photolithography process usually includes five steps of gluing treatment, pre-drying treatment, exposure treatment, development treatment and curing treatment. Therefore, it is possible to reduce the slope angle of the pixel definition layer by using the following solutions.

In the first solution, when the gluing treatment is performed, the thickness of a photolithographic material film can be reduced, so that the slope angle of the pixel definition layer can be reduced. However, higher requirements are put forward for the thickness of the photolithographic material film, because excessive reduction in the thickness of the photolithographic material film may lead to new defects and product reliability problems, while smaller reduction in the thickness is not sufficient to improve the Mura phenomenon. Therefore, it is more difficult to improve the Mura phenomenon and also avoid causing new defects and product reliability problems only by reducing the thickness of the photolithographic material film.

In the second solution, when the exposure treatment is performed, exposure defocus at an edge of a pattern can be increased to improve the exposure effect and reduce the slope angle of the pixel definition layer. For example, when an exposure focal length is set to −4 μm, the slope angle of the pixel definition layer can be reduced from 47.8° to 32.2°. Although the slope angle can be effectively reduced according to this solution, it is difficult to adjust and control the exposure treatment, the process stability cannot be ensured, and there is a risk of the pattern abnormality in the pixel definition layer.

In the third solution, when the curing treatment is performed, a drying temperature can be increased, for example, the drying temperature can be increased from 250° C. to 270° C., as such, the slope angle of the pixel definition layer can be reduced, but the magnitude of reducing the slope angle is too small to improve the Mura phenomenon. In addition, with the drying temperature switching with the temperature of the normal process, energy consumption can increase, thus reducing utilization of the drying equipment and reducing the production capacity, and to some extent affecting the stability and uniformity of the chamber temperature in the drying equipment.

In the fourth solution, the structure of a mask used in the exposure treatment and the development treatment is adjusted to reduce the slope angle of the pixel definition layer, for example, by adjusting a mask line edge semi-transparent design, the pattern design on the mask, a SRAF (i.e., Sub Resolution Assistant Feature) structure design and the like, but this needs to redesign the mask and verify its effectiveness, which will lead to a significant increase in cost and cycle.

As above described, it can be seen that although these solutions can reduce the slope angle of the pixel definition layer, there are still some problems more or less, for example, the reduction of the slope angle is not enough to improve the Mura phenomenon, poor process stability, high cost, long cycle, etc.

Therefore, in order to solve the above technical problems, the embodiment of the present disclosure provides a method for manufacturing the pixel definition layer. The method for manufacturing the pixel definition layer is a part of a process for manufacturing the display panel. The method for manufacturing other parts, such as a hole injection layer and a light-emitting layer of the display panel is not the focus of the present disclosure, and therefore will not be described in detail herein. As shown in FIG. 1, the method for manufacturing the pixel definition layer may include steps of:

S100: forming a photolithographic material film on a substrate;

S102: performing the pre-drying treatment, the first exposure treatment and the development treatment sequentially on the photolithographic material film to form an initial pattern of the pixel definition layer;

S104, performing a second exposure treatment and the curing treatment sequentially on the initial pattern to form a final pattern of the pixel definition layer.

That is to say, in this embodiment, after performing the pre-drying treatment, the exposure treatment (i.e., the first exposure treatment) and the development treatment sequentially on the photolithographic material film formed on the substrate to form the initial pattern of the pixel definition layer, and before performing the curing treatment on the initial pattern, a further exposure treatment (i.e., the second exposure treatment) is performed on the initial pattern to decompose photosensitizer in the initial pattern, that is, larger chain molecules are decomposed into small molecules, such that fluidity of the photolithographic material in the curing treatment can be enhanced to correct an edge contour of the initial pattern of the pixel definition layer, so as to reduce the formed slope angle of the final pattern of the pixel definition layer. As the finally formed slope angle of the pixel definition layer is reduced, it is easier to level the ink in the ink jet printing process, thus improve the Mura phenomenon, and ensure the product quality.

The method for manufacturing the pixel definition layer provided in the embodiment of the present disclosure will be described in detail below with reference to the accompanying figures.

Figure 2:
FIG. 2 shows a schematic view after step S100 is completed.

In S100, a photolithographic material film 30 is formed on a substrate 10, as shown in FIG. 2.

Specifically, the substrate 10 may be a flexible substrate. And the substrate 10 may be a single-layer structure or a multi-layer structure. For example, the photolithographic material may be coated on the substrate 10 by a spin coating method to form a photolithographic material film 30; however the present disclosure is not limited thereto.

The photolithographic materials may be positive photolithographic materials, such as PI (Polyimide) glue; however the photolithographic materials are not limited thereto. The photolithographic materials may also be negative photolithographic materials. In addition, the thickness of the photolithographic material film 30 may be 1.8 μm-4.5 μm, for example, 1.8 μm, 2.5 μm, 3.0 μm, and 3.5 μm, within such range the thickness of the photolithographic material film 30 is controlled in this embodiment, on the one hand, to settle the new defects and product reliability problems caused due to the photolithographic material film 30 is too thin, and on the other hand, to further reduce the slope angle of the pixel definition layer, that is, to reduce the slope angle of the final pattern 301 of the pixel definition layer by cooperating with the subsequent two steps of performing a vacuum drying treatment on the photolithographic material film 30 and performing the second exposure treatment on the initial pattern 300 of the pixel definition layer.

Figure 3:
FIG. 3 shows a schematic view after step S102 is completed.

In S102, the pre-drying treatment, the first exposure treatment and the development treatment are performed sequentially on the photolithographic material film 30 to form an initial pattern 300 of the pixel definition layer, as shown in FIG. 3.

Specifically, S102 may include steps S101, S102 and S103.

In S1021, the pre-drying treatment is performed on the photolithographic material film 30. For example, the substrate 10 on which the photolithographic material film 30 is formed may be placed in a drying apparatus for drying treatment, to promote volatilization of solvent in the photolithographic material film 30 and dry the photolithographic material film 30, thereby enhancing adhesion and abrasion resistance thereof.

As performing the pre-drying treatment, the drying temperature should not be too high, about 100° C., because too high temperature can accelerate the volatilization of solvent in the photolithographic material film 30, but also change properties of other materials in the photolithographic material film 30, thus damage the properties of the photolithographic material film 30. Therefore, in order to improve the drying effect of the photolithographic material film 30, in this embodiment, before pre-drying the photolithographic material film 30, it may further include S1020, in which vacuum drying treatment is performed on the photolithographic material film 30. For example, the substrate 10 on which the photolithographic material film 30 is formed may be put into a vacuum drying (VCD) apparatus for the drying treatment, to promote volatilization of solvent in the photolithographic material film 30 and dry the photolithographic material film 30.

It should be noted that in the vacuum drying treatment, pressure in the vacuum drying equipment affects volatilization rate of the solvent in the photolithographic material film 30, that is, the lower the pressure, the faster the volatilization rate of the solvent, and otherwise, the higher the pressure, the slower the volatilization rate of the solvent. Based on this, the vacuum drying treatment in this embodiment may include a plurality of treatment stages, and the pressures at the treatment stages are sequentially reduced to ensure that the volatilization rate of the solvent is gradually accelerated, thereby ensuring the uniform volatilization of the solvent in the photolithographic material film 30 and further ensuring the uniformity in the thickness of the photolithographic material film 30.

However, during the process of the vacuum drying treatment, the pressure in the vacuum drying equipment should not be too low, because it can cause the solvent in the photolithographic material film 30 to volatilize rapidly, thus reducing the fluidity of the photolithographic material film 30 in the subsequent pre-drying treatment, which is not helpful to make the initial pattern 300 with a smaller slope angle. Therefore, in order to produce the initial pattern 300 with the smaller slope angle while ensuring the drying effect of the photolithographic material film 30, in this embodiment, the pressure at the treatment stages in the vacuum drying treatment, particularly bottom pressure of the vacuum drying equipment can be increased. The bottom pressure is the pressure at the final treatment stage of a plurality of treatment stages in the vacuum drying treatment. For example, the bottom pressure of the vacuum drying equipment may be 300 Pa-700 Pa, such as 300 Pa, 400 Pa, 500 Pa, 600 Pa, 700 Pa, in this way, the volatilization rate of the solvent in the photolithographic material film 30 in the vacuum drying treatment can be reduced, such that the fluidity of the photolithographic material film 30 in the subsequent pre-drying treatment can be increased, and thus ensuring the thickness uniformity of the photolithographic material film 30 while reducing the thickness of the photolithographic material film 30, so as to produce the initial pattern 300 with smaller slope angle easily.

In addition, at the same time of increasing the pressure in the vacuum drying treatment, a total working time in the vacuum drying treatment can also be appropriately increased. The total working time may be in a range of 110 s to 130 s, so that the pressure in the vacuum drying treatment can be varied gently, to ensure the uniform volatilization of solvent in the photolithographic material film 30 and further ensure the uniformity of the thickness of the photolithographic material film 30.

For example, in this embodiment, adjustment of the pressure and the time at the treatment stages in the vacuum drying treatment are shown in the following table:

| Series No. | Working Time (s) | | | Target Pressure (Pa) | |
|---|---|---|---|---|---|
| | Related Art | This Embodiment | Working Stage | Related Art | This Embodiment |
| 1 | 0.5 | 0.5 | initiating stage | 0 | 0 |
| 2 | 15 | 15 | treatment stage | 10000 | 30000 |
| 3 | 1 | 15 | treatment stage | 1000 | 10000 |
| 4 | 0.5 | 2 | treatment stage | 500 | 1000 |
| 5 | 1 | 1 | treatment stage | 300 | 800 |
| 6 | 5 | 5 | treatment stage | 100 | 600 |

-continued

| | Working Time (s) | | | Target Pressure (Pa) | |
|---|---|---|---|---|---|
| Series No. | Related Art | This Embodiment | Working Stage | Related Art | This Embodiment |
| 7 | 35 | 35 | treatment stage | 26 | 500 |
| 8 | 90 | 90 | pressure holding stage | 0 | 0 |
| total working time (s) | 104 | 120 | / | / | / |

That is to say, in order to reduce the volatilization rate of the solvent in the photolithographic material film 30 during the vacuum drying treatment and increase the fluidity of the photolithographic material film 30 during the subsequent pre-drying treatment, this embodiment can adjust a target pressure at a final treatment stage in the vacuum drying treatment from 26 Pa in the related art to 500 Pa, and adjust the total working time from 104 s in the related art to 120 s.

It should also be noted that according to some embodiments of the present disclosure, the steps of the pre-drying treatment and the vacuum drying treatment may also be omitted according to specific process requirements and different photolithographic materials.

In S1022, the first exposure treatment is performed on the dried photolithographic material film 30. Specifically, light with a special wavelength can be used to perform a first exposure treatment on the photolithographic material film 30 through a mask, to transfer the pattern on the mask to the photolithographic material film 30. The light with the special wavelength may be ultraviolet light; however the present disclosure is not limited thereto.

In S1023, the development treatment is performed on the exposed photolithographic material film 30. Specifically, by adding developing liquid after the exposure treatment is finished, a photosensitive area of the positive photolithographic material or a non-photosensitive area of the negative photolithographic material will be dissolved in the developing liquid. For example, if the material of the photolithographic material film 30 is PI material, the photosensitive area of the photolithographic material film 30 will be dissolved in the developing liquid. After this step is completed, the pattern in the photolithographic material film 30 can be displayed, that is, the initial pattern 300 of the pixel definition layer is formed.

Figure 4:
FIG. 4 shows a schematic view after step S104 is completed.

In S104, the second exposure treatment and the curing treatment are performed sequentially on the initial pattern 300 to form a final pattern 301 of the pixel definition layer, as shown in FIG. 4.

Specifically, S104 may include S1041 and S1042.

In S1041, the second exposure treatment is performed on the initial pattern 300 of the pixel definition layer. For example, the second exposure treatment is performed on the initial pattern 300 by using an I-line ultraviolet light. The I-line ultraviolet light has a wavelength of 365 nm. And the I-line ultraviolet light has illumination intensity of 120 mW/cm$^2$ to 250 mW/cm$^2$, such as 120 mW/cm$^2$, 160 mW/cm$^2$, 200 mW/cm$^2$ and 250 mW/cm$^2$, as such, the photosensitizer in the initial pattern 300 of the pixel definition layer can be decomposed, that is, larger chain molecules are decomposed into smaller chain molecules, such that the fluidity of the photolithographic material in the curing treatment can be increased to correct an edge contour of the initial pattern 300 of the pixel definition layer, and to reduce the slope angle of the final pattern 301 of the formed pixel definition layer. The slope angle of the final pattern 301 of the pixel definition layer is reduced, so that it is easier to level the ink in the ink jet printing process, and thereby improving the Mura phenomenon and ensuring the product quality.

In an embodiment of the present disclosure, a photo-mask for at least exposing the side surface of the initial pattern 300 may be used in the second exposure treatment, such that the I-line ultraviolet light can at least irradiate the side surface of the initial pattern 300, and thereby increasing the fluidity of the photolithographic material during the curing treatment to correct the edge contour of the initial pattern 300 of the pixel definition layer and reduce the slope angle of the final pattern 301 of the formed pixel definition layer. In an embodiment, the photo-mask used in the second exposure treatment may completely expose the initial pattern 300. In some other embodiments, without using the photo-mask in the second exposure treatment, the I-line ultraviolet light can directly irradiate the initial pattern 300.

It should be noted that after the illumination intensity of the I-line ultraviolet light reaches a certain level, the slope angle cannot be continuously improved by continuously increasing the illumination intensity. Thus, the illumination intensity of the I-line ultraviolet light is controlled within a range of 120 mW/cm$^2$ to 250 mW/cm$^2$.

In S1042, the curing treatment is performed on the exposed initial pattern 300 of the pixel definition layer to form the final pattern 301 of the pixel definition layer, that is, the pixel definition layer is produced. For example, the curing treatment is performed on the exposed initial pattern 300 of the pixel definition layer by a convection heating furnace, in which a heating temperature may be about 250° C. to completely evaporate the solvent in the initial pattern 300 so as not to pollute the subsequent ion injection environment. It should be noted that the solvent can be a solvent of the photolithographic material itself or a developing liquid. In addition, by performing the curing treatment on the exposed initial pattern 300 of the pixel definition layer, the formed final pattern 301 of the pixel definition layer is a hard film to improve a capability of the final pattern 301 of the pixel definition layer to protect the lower surface in a subsequent etching process.

Improvement effects of the various embodiments can be described in detail below with reference to the accompanying figures:

FIG. 5 shows a comparison diagram of test results of pixel definition layers produced according to three embodiments.

In the first embodiment, when the pixel definition layer is manufactured, bottom pressure of the vacuum drying treatment is 26 Pa, and the I-line ultraviolet light for performing the second exposure treatment is not turned on, that is, the exposure treatment is not performed on the initial pattern 300 after the initial pattern 300 is formed. A test result of the products manufactured according to this embodiment show that the slope angle $\alpha_1$ on the left side of the pixel definition layer is 47.2°, and the slope angle $\alpha_2$ on the right side of the pixel definition layer is 49.7°. Also, by testing five samples cut from one product, and an average value of the slope angle of the pixel definition layer is 47.8°.

In the second embodiment, when the pixel definition layer is manufactured, the bottom pressure of the vacuum drying treatment is 26 Pa, and the I-line ultraviolet light for performing the second exposure treatment is turned on, that is, the exposure treatment is performed on the initial pattern 300 after the initial pattern 300 is formed. A test result of the products manufactured according to this embodiment show that the slope angle $\beta_1$ on the left side of the pixel definition layer is 32.6°, and the slope angle $\beta_2$ on the right side of the pixel definition layer is 32.1°. Also, by testing five samples cut from one product, an average value of the slope angle of the pixel definition layer is 33.2°.

In the third embodiment, when the pixel definition layer is manufactured, the bottom pressure of the vacuum drying treatment is adjusted to be 500 Pa, and the I-line ultraviolet light for performing the second exposure treatment is turned on, that is, the exposure treatment is performed on the initial pattern 300 after the initial pattern 300 is formed. A test result of the products manufactured according to this embodiment show that the slope angle $\gamma_1$ on the left side of the pixel definition layer (i.e., the final pattern 301) is 29.7°, and the slope angle $\gamma_2$ on the right side of the pixel definition layer is 30.6°. Also, by testing five samples cut from one product, an average value of the slope angle of the pixel definition layer is 30.4°.

It should be noted that when the pixel definition layer is manufactured according to the above three implementations, the pressure of vacuum drying treatment and whether the exposure treatment is performed on the initial pattern 30 are different, and the other manufacturing conditions are the same.

FIG. 6 shows a comparison diagram of test results of the pixel definition layers manufactured according to the other two embodiments.

In the fourth embodiment, when the pixel definition layer is manufactured, the thickness of the photolithographic material film 30 is 3.5 μm, the bottom pressure of the vacuum drying treatment is 26 Pa, and the I-line ultraviolet light for performing the second exposure treatment is turned on, that is, the exposure treatment is performed on the initial pattern 300 after the initial pattern 300 is formed. A result of testing the products manufactured according to this embodiment shows that the slope angle of the pixel definition layer is 32.2°. Also, according to this solution, because of different printing thicknesses, such as 8 μm, 10 μm, and 12 μm as shown in FIG. 6, severity levels of the Mura phenomenon of the products are different.

In the fifth embodiment, when the pixel definition layer is manufactured, the thickness of the photolithographic material film 30 is 3 μm, the bottom pressure of the vacuum drying treatment is 500 Pa, and the I-line ultraviolet light for performing the second exposure treatment is turned on, that is, the exposure treatment is performed on the initial pattern 300 after the initial pattern 300 is formed. A result of testing the products manufactured according to this embodiment shows that the slope angle of the pixel definition layer is 23.5°. And according to this solution, because of different printing thicknesses, such as 8 μm, 10 μm, and 12 μm as shown in FIG. 6, severity levels of the Mura phenomenon of the products are different.

L0, L1 and L3 shown in FIG. 6 represent the severity levels of the Mura phenomenon of the products, L0 and L1 represent that there is no Mura or the Mura is very slight, L3 represents that Orange Mura is very serious.

It should be noted that when the pixel definition layer is manufactured according to the above two implementations, the thickness of the photolithographic material film 30 and the pressure of the vacuum drying treatment are different, and the other manufacturing conditions are the same.

The slope angles in FIG. 5 and FIG. 6 are manually measured so there may be a measurement error, and the measurement error may be within 5 degrees. Due to the difference in thickness, the slope angles may be different. The range of the slope angle of the pixel definition layer corresponding to G pixels are 23°-30°. The area of the R/B pixels are larger, and the slope may be a bit gentler. The range of the slope angles of the pixel definition layer corresponding to R/B pixels are 21°-28°. The brightness of the pixel unit is positively correlated with the pixel definition layer opening area, and the pixel definition layer opening area corresponding to the G pixel is smaller than the pixel definition layer opening area corresponding to the R/B pixel. The ratio of the pixel definition layer opening area corresponding to R, G, B is R:G:B=1:a:b; for example, "a" is in a range of 0.5~0.7, and "b" is in a range of 1.4~1.9. For example, the ratio of the pixel definition layer opening area corresponding to R, G, B is R:G:B=1:0.6:1.4; or R:G:B=1:0.65:1.6; or R:G:B=1:0.65:1.7; or R:G:B=1:0.65:1.75; or R:G:B=1:0.67:1.8; or R:G:B=1:0.7:1.9.

As can be seen, in order to realize requirement for mass production, the fifth embodiment is preferably adopted in the present disclosure. According to the fifth embodiment, the slope angle of the pixel definition layer (i.e., the final pattern 301) may be smaller than 25°, such that the Mura phenomenon caused by leveling the ink can be improved effectively, and RGB dark vertical stripes and color mixing conditions generated at the rear end can be further improved. In addition, the printing thickness of the light-emitting layer can be appropriately reduced, for example, from the original 12 μm to 8 μm without causing the Mura phenomenon, so as to reduce the printing cost, printing time and thus improve productivity while ensuring the product quality.

In addition, an embodiment of the present disclosure also provides a method for manufacturing the display panel, including steps of:

S10, forming a pixel definition layer on the substrate, and the pixel definition layer is manufactured by the method for manufacturing the pixel definition layer described in any one of the above embodiments.

S20, forming a light-emitting layer in an opening area on the pixel definition layer;

S30, forming a packaging layer on the light-emitting layer.

For example, the packaging layer may include an organic packaging film. However, forming the packaging layer on the light-emitting layer may include forming an organic packaging film on the light-emitting layer by using an ink jet printing process.

Furthermore, an embodiment of the present disclosure also provides a display panel, which is manufactured by the method for manufacturing the display panel. The display panel may be an OLED (Organic Light-Emitting Diode) display panel, especially an AMOLED display panel, but the present disclosure is not limited thereto.

The technical solution provided by the present disclosure can achieve beneficial effects below.

According to the method for manufacturing the pixel definition layer provided by the present disclosure, after performing the pre-drying treatment, the first exposure treatment and the development treatment sequentially on the photolithographic material film formed on the substrate to form the initial pattern of the pixel definition layer, the second exposure treatment is performed on the initial pattern of the pixel definition layer to decompose photosensitizer in the initial pattern, that is, larger chain molecules are decomposed into small chain molecules, such that fluidity of the photolithographic material in the curing treatment can be enhanced to correct an edge contour of the initial pattern of the pixel definition layer, so as to reduce the formed slope angle of the final pattern of the pixel definition layer. As the slope angle of the pixel definition layer is reduced, it is easier to level the ink in the ink jet printing process thus improve the Mura phenomenon, and ensure the product quality.

Other embodiments of this application will be apparent to those skilled in the art for consideration of the specification and practice of the disclosure herein. This application is intended to cover any variations, uses, or adaptations of the invention following the general principles thereof and including such departures from the present disclosure as come within known or customary practice in the art. It is intended that the specification and examples can be considered as illustrative only, with a real scope and spirit of the invention being indicated by the following appended claims.

What is claimed is:

1. A method for manufacturing a pixel definition layer, comprising:
   forming a photolithographic material film on a substrate;
   performing a first exposure treatment and a development treatment sequentially on the photolithographic material film to form an initial pattern of the pixel definition layer; and
   performing a second exposure treatment and a curing treatment sequentially on the initial pattern to form a final pattern of the pixel definition layer, wherein the second exposure treatment decomposes photosensitizer in the initial pattern to decompose chain molecules of the photosensitizer into molecules smaller than the chain molecules, so as to enhance fluidity of photolithographic material of the photolithographic material film in the curing treatment to correct an edge contour of the initial pattern, to reduce a formed slope angle of the final pattern of the pixel definition layer.

2. The method according to claim 1, wherein performing the second exposure treatment on the initial pattern comprises: performing the second exposure treatment on the initial pattern by using an I-line ultraviolet light.

3. The method according to claim 2, wherein an illumination intensity of the I-line ultraviolet light is 120 mW/cm$^2$ to 250 mW/cm$^2$.

4. The method according to claim 1, wherein performing the second exposure treatment on the initial pattern comprises: exposing the initial pattern by using a photo-mask that exposes at least side surfaces of the initial pattern.

5. The method according to claim 1, further comprising performing pre-drying treatment on the photolithographic material film before performing the first exposure treatment on the photolithographic material film.

6. The method according to claim 5, further comprising performing vacuum drying treatment on the photolithographic material film before performing the pre-drying treatment on the photolithographic material film.

7. The method according to claim 6, wherein the vacuum drying treatment comprises a plurality of treatment stages, and pressures at the treatment stages are sequentially reduced.

8. The method according to claim 7, wherein the pressure at a final treatment stage of the treatment stages is 300 Pa to 700 Pa.

9. The method according to claim 6, wherein a total working time used in the vacuum drying treatment is 110 s to 130 s.

10. The method according to claim 1, wherein a thickness of the photolithographic material film is 1.8 μm-4.5 μm.

11. A method for manufacturing a display panel, comprising:
    forming a pixel definition layer on a substrate, comprising:
    forming a photolithographic material film on a substrate;
    performing a first exposure treatment and a development treatment sequentially on the photolithographic material film to form an initial pattern of the pixel definition layer;
    performing a second exposure treatment and a curing treatment sequentially on the initial pattern to form a final pattern of the pixel definition layer;
    forming a light-emitting layer in an opening area on the pixel definition layer; and
    forming a packaging layer on the light-emitting layer,
    wherein the second exposure treatment decomposes photosensitizer in the initial pattern to decompose chain molecules of the photosensitizer into molecules smaller than the chain molecules, so as to enhance fluidity of photolithographic material of the photolithographic material film in the curing treatment to correct an edge contour of the initial pattern, to reduce a formed slope angle of the final pattern of the pixel definition layer.

12. The method according to claim 11, wherein:
    the packaging layer comprises an organic packaging film; and
    forming the packaging layer on the light-emitting layer comprises forming an organic packaging film on the light-emitting layer by using an ink jet printing process.

13. A display panel manufactured by the method for manufacturing the display panel according to claim 11.

14. The method according to claim 11, wherein performing the second exposure treatment on the initial pattern comprises performing the second exposure treatment on the initial pattern by using an I-line ultraviolet light.

15. The method according to claim 14, wherein an illumination intensity of the I-line ultraviolet light is 120 mW/cm$^2$ to 250 mW/cm$^2$.

16. The method according to claim 11, wherein performing the second exposure treatment on the initial pattern comprises exposing the initial pattern by using a photo-mask that exposes at least side surfaces of the initial pattern.

17. The method according to claim 11, further comprising performing pre-drying treatment on the photolithographic material film before performing the first exposure.

* * * * *